United States Patent [19]

Migita et al.

[11] Patent Number: 5,026,661
[45] Date of Patent: Jun. 25, 1991

[54] METHOD OF MANUFACTURING ZINC CHALCOGENIDE SEMICONDUCTOR DEVICES USING LP-MOCVD

[75] Inventors: Masahito Migita, Hachioji; Osamu Kanehisa, Kodaira; Masatoshi Shiiki, Musashimurayama; Hajime Yamamoto, Tokyo, all of Japan

[73] Assignee: Hitachi, Ltd., Tokyo, Japan

[21] Appl. No.: 423,552

[22] Filed: Oct. 13, 1989

Related U.S. Application Data

[63] Continuation of Ser. No. 190,751, May 5, 1988, abandoned.

[30] Foreign Application Priority Data

May 8, 1987 [JP] Japan ............... 62-110676

[51] Int. Cl.$^5$ ............... H01L 21/20
[52] U.S. Cl. ............... 437/81; 148/DIG. 40; 148/DIG. 41; 148/DIG. 64; 148/DIG. 110; 156/613; 437/94; 437/916; 437/959

[56] References Cited

U.S. PATENT DOCUMENTS

| | | | |
|---|---|---|---|
| 3,880,743 | 4/1975 | Lang | 204/165 |
| 4,193,835 | 3/1980 | Inoue et al. | 156/606 |
| 4,523,189 | 6/1985 | Takahara et al. | 357/13 |
| 4,547,703 | 10/1985 | Fujita et al. | 357/10 |
| 4,613,793 | 9/1986 | Panicker | 313/506 |
| 4,689,522 | 8/1987 | Robertson | 313/509 |
| 4,717,859 | 11/1988 | Sohn | 313/509 |

OTHER PUBLICATIONS

Wilkinson et al., "On Manganese Cyclopentadienide . . .", J. Inorg. and Nucl. Chem., vol. 2, 1956, pp. 95-113.
Reynolds et al., "Some Methylcyclopentadienyl-Metal Compounds", J. Inorg. Nucl. Chem., vol. 9, 1959, pp. 86-92.
Mino et al., "Plasma-Assisted Metalorganic Chemical Vapor Deposition of ZnSe Films", J. Appl. Phys. 59(6), 15 Mar. 1986, pp. 2216-2221.
Yasuda et al., "Low Resistivity Al-Doped ZnS Grown by MOVPE", J. Crys. Growth, 77 (1986), pp. 485-489.
Cozak et al., "Direct Observation . . . Manganocene Derivatives . . . ", Can. J. Chem., vol. 64, 1986, pp. 71-75.
Hirabayashi et al., "ZnSiMn Electroluminescent Device Prepared by Metal-Organic Chemical Vapor Deposition", Jpn. J. Appl. Phys., vol. 25, No. 5, May 1986, pp. 711-713.

*Primary Examiner*—Olik Chaudhuri
*Assistant Examiner*—William Bunch
*Attorney, Agent, or Firm*—Antonelli, Terry, Stout & Kraus

[57] ABSTRACT

A method of growing zinc chalcogenide in an atmosphere which contains the vapor of di-$\pi$-cyclopentadienyl manganese or di-$\pi$-alkyl cyclopentadienyl manganese that serves as a source of manganese. By growing zinc chalcogenide in the above atmosphere, there is obtained a manganese-doped zinc chalcogenide having a very high crystal quality, which is very suitable for the active layer in light emitting devices.

22 Claims, 2 Drawing Sheets

METHOD OF MANUFACTURING ZINC CHALCOGENIDE SEMICONDUCTOR DEVICES USING LP-MOCVD

This application is a continuation of application Ser. No. 07/190,751, filed May 5, 1988 abandoned.

BACKGROUND OF THE INVENTION

1. Field of the Invention

The present invention relates to a method of manufacturing semiconductor devices, and more specifically to a method of manufacturing semiconductor light emitting devices such as electroluminescent devices. The electroluminescent device which is a representative semiconductor light emitting device with which the present invention is concerned, can be used for a variety of display devices such as displays for computer terminal equipment and electronic typewriters, as well as monitoring devices for TV's.

2. Description of the Related Arts

The electroluminescent device which has heretofore been known can be represented by an alternating current thin film electroluminescent (ACTFEL) device. The ACTFEL device usually consists of a light emitting layer (e.g., thin ZnS:Mn film) held by an insulating layer on a glass substrate that supports one of the two opposing electrodes. The light emitting layer has heretofore been formed by sputtering or electron beam deposition. In either case, however, there is not obtained the light emitting layer that exhibits light emitting characteristics to a sufficient degree. That is, the layer after it is formed must be subjected to the heat treatment at 450° C. or higher for about two hours. At the current technical level, furthermore, the device having the light emitting layer obtained by the above method exhibits an average intensity of about 20 ft-L even when it is excited with a voltage of as high as 200 volts at 60 Hz. If the thickness of the layer is reduced to decrease the exciting voltage, the intensity decreases, too, making it difficult to obtain satisfactory characteristics.

U.S. Pat. No. 4,496,610 and Japanese Patent Laid-Open No. 176897/1983 disclose a method of producing a light emitting layer composed of zinc chalcogenide doped with manganese by acting dimethyl zinc which is alkyl zinc and a gaseous hydrogenate compound of either sulfur or selenium which is chalcogen on a hot substrate in the presence of a tricarbonyl methylcyclopentadienyl manganese (TCM) vapor. According to this method, zinc chalcogenide is chemically grown by chemical vapor deposition (CVD) on the substrate and, at the same time, manganese which is a dopant is diffused. By adjusting the vapor pressures for forming the CVD atmosphere, therefore, there can be formed the light emitting layer that is stoichiometrically controlled. Furthermore, the light emitting layers having uniform quality and uniform thickness can be simultaneously formed on many substrates having large areas.

However, the light emitting efficiency of the light emitting layer obtained by this method is inferior to that of the light emitting layer obtained by the conventional sputtering method or electron beam deposition method. This is due to the fact that the TCM is poorly decomposed by heat. That is, the TCM can be sufficiently decomposed only when it is heated at a temperature of as high as 550° C. or more. Moreover, oxygen exists in the chemical structure of TCM. According to this fabrication method, the light emitting thin film is crystallized most desirably at a temperature of from 300° to 380° C. When the layer is formed by CVD on the substrate heated in this temperature range, however, the TCM is not completely decomposed. Instead, intermediate decomposition products having an Mn-O-$CO_2$ type coupling structure are formed in the light emitting layer, which are detrimental to obtaining light emitting layer of high crystallinity. Moreover, ZnO:Mn which works as a non-emitting center is formed in the crystal lattices. Further, when the layer is formed at a substrate temperature of higher than 400° C., the reaction does not take place on the surface of the substrate but, instead, a so-called premature reaction takes place abruptly in an atmosphere on the surface of the substrate. Therefore, growth of crystals is impaired on the surface of the substrate, and satisfactory light emitting characteristics are not obtained.

Therefore, the manganese-doped zinc chalcogenide that exhibits satisfactory light emitting characteristics was not obtained by the above-mentioned prior art method.

SUMMARY OF THE INVENTION

In accordance with one aspect of the present invention, there is provided a method of manufacturing a semiconductor device having a manganese-doped zinc chalcogenide with favorable crystalline structure. According to this method of manufacturing semiconductor devices, use is made of a di-$\pi$-cyclopentadienyl manganese (DCPM), a di-$\pi$-methyl cyclopentadienyl manganese (DMCPM) which is a di-$\pi$-alkyl cyclopentadienyl manganese or a di-$\pi$-ethylcyclopentadienyl manganese (DECPM) as a source of manganese, and a step is included to bring the vapor of an organozinc compound and the vapor of an alkyl compound or a hydrogenate compound of either sulfur or selenium into contact with a hot substrate.

In accordance with one aspect of the present invention, there is provided a method of manufacturing a semiconductor device having a manganese-doped zinc chalcogenide that features a high intensity and a high efficiency.

In accordance with a more limited aspect of the present invention, there is provided a method of manufacturing a semiconductor device having a manganese-doped zinc chalcogenide of a high purity which is very close to a stoichiometric ratio.

In accordance with another aspect of the present invention, there is provided a method of manufacturing improved manganese-doped zinc chalcogenide.

One advantage of the present invention is that there is manufactured a semiconductor device having high reliability.

Another advantage of the present invention is that intermediate decomposition products are formed very little in the manganese-doped zinc chalcogenide, non-emitting centers are formed very little in the crystal lattice, carbon is not highly concentrated, and manganese masses are not introduced. By using the manganese-doped zinc chalcogenide as a light emitting layer, therefore, there is obtained an electroluminescent device that operates on a low voltage and that exhibits high light emitting efficiency and high reliability.

Still further advantages of the present invention will become apparent to those of ordinary skill in the art upon reading and understanding the following detailed description of the preferred embodiments.

BRIEF DESCRIPTION OF THE DRAWINGS

The invention may take from in various parts and arrangements of parts or in various steps and arrangements of steps. The drawings are only for purpose of illustrating the preferred embodiments and are not to be construed as limiting the invention.

FIG. 4 is a diagram illustrating the structure of an electron injection-type DC electroluminescent device;

DESCRIPTION OF THE PREFERRED EMBODIMENTS

As described above in the section of SUMMARY OF THE INVENTION, the method of manufacturing the electroluminescent devices according to the present invention essentially consists of bringing the vapor of an organozinc compound and the vapor of an alkyl compound or a hydrogenate compound of either sulfur or selenium at a predetermined chalcogen vs. zinc molar ratio into contact with a hot substrate in the presence of at least one vapor selected from the group consisting of DCPM, DMCPM and DECPM, or in the presence of an inert gas such as hydrogen or helium containing the above vapor. In particular, the electroluminescent device having a light emitting layer composed of manganese-doped zinc chalcogenide manufactured through the above-mentioned step, operates on a low voltage, and exhibits marked progress in the light emitting efficiency and reliability. In the present invention, manganese is doped as an activator in the zinc chalcogenide to form such compounds as ZnS:Mn, ZnSe:Mn, and the like.

In the present invention, a preferred layer is obtained by using zinc dimethyl or zinc diethyl as the above-mentioned organozinc compound.

As the alkyl compound and hydrogenate compound of chalcogen, furthermore, there can be used dimethyl sulfide, diethyl sulfide, mercaptan ($CH_3SH$), hydrogen sulfide, dimethyl selenide, diethyl selenide and hydrogen selenide to obtain layers having good characteristics.

Instead of the vapor of an organozinc compound and the vapor of alkyl compound of sulfur, furthermore, there can be used the vapor of an adduct composed of dimethyl zinc or diethyl zinc and dimethyl sulfide or diethyl sulfide to obtain a favorable film.

In the present invention, furthermore, the substrate should be heated at 100° to 390° C., and more preferably at 200° to 340° C. when it is brought into contact with the reaction gas, i.e., when the manganese-doped zinc chalcogenide layer is being formed.

During the reaction, the atmosphere pressure should be from 0.3 Torr to 1 atm., and preferably from 0.6 to 2 Torr.

The invention will now be described in detail in conjunction with the embodiments.

EMBODIMENT 1

Figure 2A:
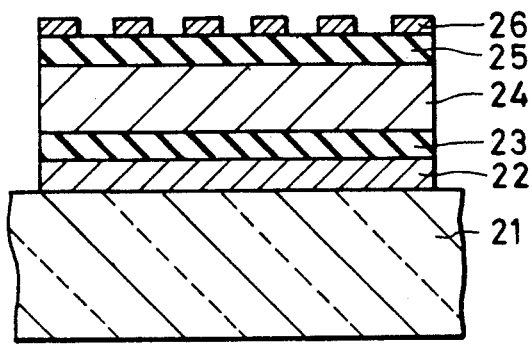
FIGS. 2A, 2B and 4 are section views of electroluminescent devices manufactured according to embodiments of the present invention.
Figure 2B:
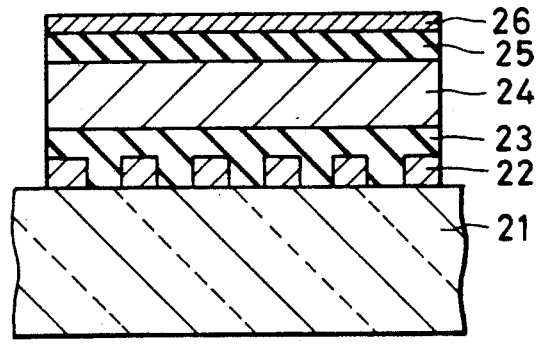

The method of manufacturing the semiconductor device of the present invention will now be described in detail with reference to an embodiment which is applied to the ACTFEL device in conjunction with FIGS. 2A and 2B, which are section views of when the ACTFEL device is viewed from the directions perpendicular to each other. The ACTFEL device fundamentally consists of a substrate 21 (usually, a light transmitting substrate composed of glass or the like) on which are successively laminated transparent electrodes 22 composed of a thin film of, for example, indium-tin oxide (ITO), a dielectric insulating film 23 composed of $Ta_2O_5$, $SiO_2$, $BaTiO_3$ or $Y_2O_3$, a light emitting layer 24, an insulating film 25 composed of the same material as the film 23, and metal electrodes 26 composed of aluminum or the like. In order to arrange the light emitting points of the ACTFEL element in the form of a matrix, the electrodes 22 and 26 in the form of stripes are usually provided in a plural number, the striped electrodes 22 and 26 crossing with each other. That is, the ITO thin film is formed on the light transmitting substrate by a method widely known among those skilled in the art, for example, by vapor deposition, and is then divided into a plurality of striped electrodes 22 by etching (FIG. 2B). The electrodes may be formed in the shape of stripes from the first time by masked vapor deposition.

Next, the dielectric insulating layer 23 is formed on the transparent electrodes 22 by widely known sputtering or electron beam deposition. By employing a step of forming a manganese-doped zinc chalcogenide layer which makes the feature of the present invention, the light emitting layer 24 is formed in the insulating layer 23, and the insulating layer 25 composed of a dielectric material such as $Y_2O_3$, $SiO_2$, $Ta_2O_5$ or $BaTiO_3$ is formed on the light emitting layer by sputtering or electron beam deposition. The metal electrodes 26 are then formed in the shape of stripes by masked deposition. The direction of the striped metal electrodes 26 is usually at right angles with the direction of the striped transparent electrodes 22 (FIG. 2A). By crossing the upper and lower striped electrodes relative to each other, the light emitting portions of the ACTFEL device can be arranged in the form of a matrix. Further, it can be easily implied by people skilled in the art to obtain a multi-layer ACTFEL device by further forming transparent electrodes instead of the metal electrodes 26, and by forming thereupon another set of or a plural sets of light emitting regions each being successively comprised of the insulating layer, light emitting layer, insulating layer and electrodes.

Here, the light emitting layer 24 is formed in a manner as described below. That is, the substrate on which the insulating layer 23 has been formed is placed on a heating member under a high vacuum condition (about $1 \times 10^{-7}$ Torr), followed by the introduction of hydrogen that has passed through a DMCPM bubbler cooled at about 5° C., hydrogen sulfide and diethyl zinc at an S/Zn molar flow rate ratio of 10, so that a thin ZnS:Mn film grows on the surface of the insulating layer 23 until the thickness becomes about 500 nm under a pressure during the reaction of 1.5 Torr. In this case, the DMCPM is introduced in an amount of 0.85% by weight of the flow rate of zinc.

On the thus formed light emitting layer 24 are formed the insulating layer 25 composed of $Ta_2O_5/SiO_2$ and metal electrodes 26. The thus fabricated electroluminescent device is measured for its intensity by applying an AC rectangular wave voltage of 150 volts, 50 Hz, and duty 1/10.

For comparison, an electroluminescent device is fabricated under the same conditions but using TCM as a source of manganese instead of using DMCPM, to measure the intensity.

Figure 1:
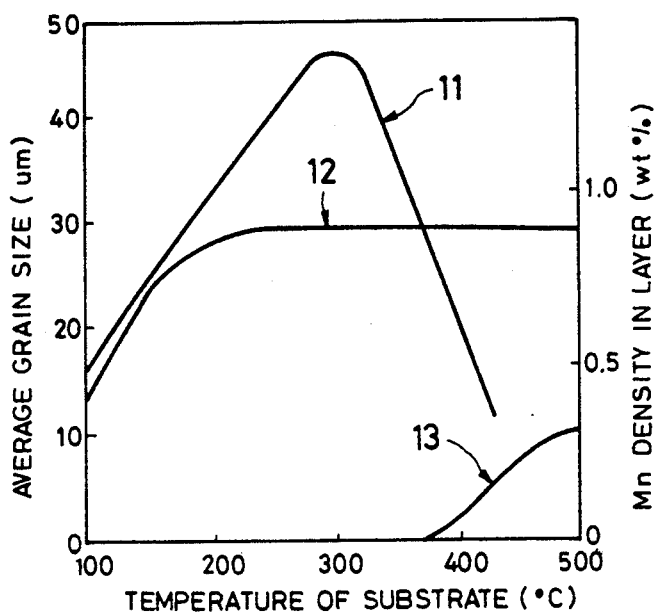
FIG. 1 is a graph showing a relationship between the manganese density and the temperature of the substrate at the time of reaction using an electroluminescent device manufactured according to the present invention and an electroluminescent device manufactured according to the prior method.

Tables 1 and 2 show the temperatures of the substrate during the reaction, average grain size of the ZnS layer, manganese density in the layer (percent by weight of manganese in ZnS:Mn) and intensities of these two samples, and FIG. 1 shows relationships among the temperatures of the substrate during the reaction, average grain size of the light emitting layer and manganese density in the layer. Here, the average grain size is based on the X-ray diffraction measurements of full-width of half-maximum, and the relative intensity represents a value of when the intensity is 100 that is obtained by the light emitting layer fabricated by the standard electron beam deposition method. In FIG. 1, furthermore, a curve 11 represents the average grain size of the case when DMCPM is used, a curve 12 represents the manganese density in the layer of the case when DMCPM is used, and a curve 13 represents the manganese density in the layer of the case when TCM is used.

Comparison of Table 1 with Table 2, or comparison of the curve 12 with the curve 13 in FIG. 1 indicates that according to the method of manufacturing the semiconductor device of the present invention, the zinc chalcogenide crystals are easily doped with manganese at a density of 0.3 to 0.8% by weight. Very excellent light emitting efficiency is exhibited by the electroluminescent device which has, as the light emitting layer, the zinc chalcogenide layer that contains manganese at a density over the above-mentioned range.

TABLE 1

Electroluminescent device using DMCPM

| Substrate temp. (°C.) | Average grain size (nm) | Relative intensity (%) | Manganese density in layer (%) |
|---|---|---|---|
| 100 | 14 | 170 | 0.6 |
| 150 | 25 | 200 | 0.7 |
| 200 | 36 | 300 | 0.8 |
| 250 | 40 | 350 | 0.8 |
| 300 | 46 | 400 | 0.8 |
| 350 | 34 | 300 | 0.8 |
| 400 | 15 | 200 | 0.8 |
| 430 | 10 | 100 | 0.8 |

TABLE 2

Electroluminescent device using TCM

| Substrate temp. (°C.) | Average grain size (nm) | Relative intensity (%) | Manganese density in layer (%) |
|---|---|---|---|
| 100 | 14 | 0 | 0 |
| 150 | 25 | 0 | 0 |
| 200 | 36 | 0 | 0 |
| 250 | 40 | 0 | 0 |
| 300 | 46 | 30 | 0.04 |
| 350 | 34 | 40 | 0.08 |
| 400 | 15 | 80 | 0.12 |
| 450 | 10 | 75 | 0.2 |

From these results, it is learned that the device exhibits excellent intensity and stability in structure when DMCPM is used compared with when TCM is used. When DMCPM is used, furthermore, the substrate temperature should range from 100° to 390° C., and preferably from 200° to 340° C. during the reaction.

An electroluminescent device was fabricated having the Al/$Ta_2O_5$ (380 nm)/$SiO_2$ (120 nm)/ZnS:Mn (500 nm)/$SiO_2$ (120 nm)/$Ta_2O_5$ (380 nm)/ITO/glass structure, and an AC sinusoidal wave of 200 volts and 1 KHz was applied thereto. The device exhibited a maximum intensity when it was fabricated at a substrate temperature of 280° C. during the reaction, the maximum intensity being 2050 ft-L. This device exhibits the light emitting efficiency of 5.2 lm/W.

EMBODIMENT 2

A substrate on which are formed up to the insulating layer 23 like in the embodiment 1 is placed in a reaction vessel that is evacuated to a high degree of vacuum (about $1 \times 10^{-7}$ Torr), a hydrogen gas containing DMCPM is introduced thereinto followed by the introduction of dimethyl zinc and selenium hydride, which are then brought into contact with the insulating film on the substrate heated at various temperatures over a range of from 200° to 450° C., thereby to prepare a ZnSe:Mn crystal layer. The obtained samples are then subjected to the measurement of X-ray diffraction, stoichiometrical analysis of composition and analysis of impurities in the film. For the purpose of comparison, furthermore, the ZnSe:Mn crystal layer is prepared under the same conditions but using TCM as a source of manganese, and the obtained samples are measured and analyzed in the same manner as described above.

As a result, it is learned that when DMCPM is used, a highly pure ZnSe:Mn crystal layer is obtained which is close to a stoichiometrical composition having an average grain size of 600 nm when it is prepared at a substrate temperature of about 280° C. during the reaction. When TCM is used, on the other hand, there is obtained a crystal layer containing Mn-O-$CO_2$ as impurity when it is prepared near at 280° C. When the temperature is further elevated during the reaction, the degree of crystallinity decreases.

EMBODIMENT 3

A substrate on which are formed up to the insulating layer 23 is placed in a reaction vessel that is evacuated to a high degree of vacuum (about $1 \times 10^{-7}$ Torr), a hydrogen gas containing DECPM is introduced thereinto followed by the introduction of the vapor of an adduct of diethyl zinc and diethyl sulfur and hydrogen sulfide as a source of the VI group, which are then brought into contact with the insulating layer on the substrate heated at various temperatures over a range of 100° to 450° C. thereby to form a ZnS:Mn crystal layer 24 having a thickness of about 500 nm. On the ZnS:Mn layer is formed an insulating layer 25 composed of $Ta_2O_5/SiO_2$ having a thickness of 250 nm followed by the formation of metal electrodes 26 of aluminum to obtain an electroluminescent device. When an AC sinusoidal wave voltage of 220 volts, 1 KHz is applied thereto, the device exhibits a maximum intensity, i.e., 1800 ft-L when it is prepared at a substrate temperature of 300° C. during the reaction. For the purpose of comparison, an electroluminescent device is fabricated through the same steps but using TCM as a source of manganese. When the intensity is measured under the same conditions, the highest intensity is exhibited by the device that is fabricated at the substrate temperature of 430° C. during the reaction, the intensity, however, being 340 ft-L.

The same effects are also obtained even when there is used an adduct of diethyl zinc and dimethyl sulfur or an adduct of dimethyl zinc and dimethyl sulfur or diethyl sulfur, in addition to the adduct of diethyl zinc and diethyl sulfur.

EMBODIMENT 4

Figure 3:
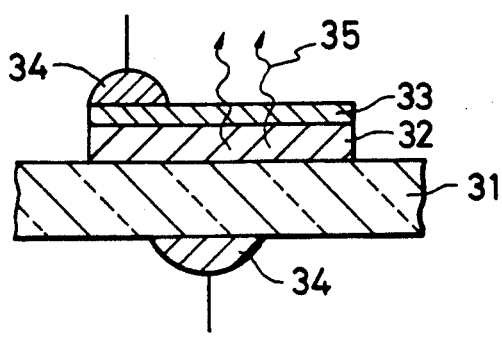
FIG. 3 is a diagram illustrating the structure of an electron injection-type DC electroluminescent device.

FIG. 3 is a diagram illustrating the structure of an electron injection-type DC electroluminescent device. A layer 32 of $ZnSe_{0.92}S_{0.08}:Mn$ is grown to have a thickness of 0.3 μm on a p-type small resistance GaAs(100) substrate 31. In this case, the raw material of the group VI consists of a mixture of Se and S at a molar ratio of 0.98 to 0.02, and the raw material of the group II consists of dimethyl zinc. These materials are introduced into a reaction vessel at a [VI]/[II] molar flow rate ratio of 10. The layer is grown under a pressure of 0.5 Torr during the reaction and at a substrate temperature of 350° C. DMCPM is used as a source of manganese, and is introduced into the reaction vessel at a [DMCPM]/[II] molar ratio of 0.2:100. Then a gold electrode 33 is deposited maintaining a thickness of 0.1 μm on the thin $ZnSe_{0.92}S_{0.08}:Mn$ film 32. Further, an indium electrode 34 is attached to the lower surface of the GaAs substrate to fabricate a DC EL device. Reference numeral 35 represents emission of light. In this case, the threshold voltage is 7.0 volts and a maximum intensity is 40 to 70 ft-L.

DCPM (di-t-cyclopentadienyl manganese) is used as a manganese material, and the device is fabricated under the same condition at a substrate temperature of 350° C., that exhibits favorable threshold voltage and intensity.

There is further obtained a device that exhibits favorable characteristics even when it is fabricated using DECPM as a manganese material and at a substrate temperature of 300° C.

EMBODIMENT 5

Figure 4:
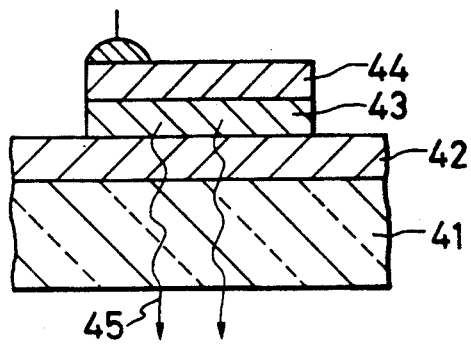

FIG. 4 is a diagram illustrating the structure of an electron injection-type DC electroluminescent device. A substrate is obtained by deposition an ITO transparent electrode 42 maintaining a thickness of 0.02 μm on a glass 41, and a ZnS:Mn layer 43 is grown thereon maintaining a thickness of 0.2 μm. The layer in this case is grown at a molar flow rate ratio of hydrogen sulfide to diethyl zinc of 10, using DMCPM as a manganese material, at a substrate temperature of 350° C. and under a pressure of 1.0 Torr in the reaction vessel. The manganese density is selected to range from 0.1 to 0.3% by weight in the ZnS:Mn layer. Then, a gold electrode 44 is deposited maintaining a thickness of 0.5 μm to obtain a DC electroluminescent device. The light emitting layer 43 emits light as designated at 45. The device exhibits a threshold voltage of 6.0 volts and a maximum intensity of 60 to 110 ft-L. The DC electroluminescent elements that exhibit high intensity are obtained even when DCPM and DECPM are used as a manganese material.

In the foregoing were described embodiments where DMCPM and DECPM were used as a source of manganese. Next, described below is an embodiment where DCPM is used to produce the device.

EMBODIMENT 6

Figure 6:
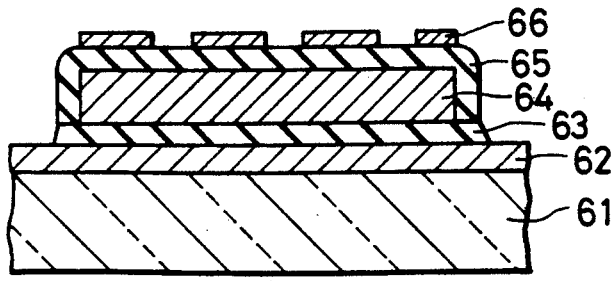
FIG. 6 is a section view of an ACTFEL device.

FIG. 6 is a section view of an ACTFEL device which consists of a transparent electrode (e.g., indium-tin-oxide thin film; ITO) 62, an insulating layer (e.g., $Ta_2O_5/SiO_2$) 63, a light emitting layer 64, an insulating layer (same as the above insulating layer 63) 65, and a metal electrode (e.g., aluminum) 66, that are successively formed on a glass substrate 61. The layers, except the light emitting layer 64, are formed in the same manner as in the embodiment 1.

The light emitting layer 64 is formed as described below. That is, the substrate on which up to the insulating layer 63 have been formed is placed on a heating member under a high vacuum condition (about $1 \times 10^{-7}$ Torr). Then, a hydrogen gas that has passed through a DCPM bubbler heated at about 70° C., and hydrogen sulfide and diethyl zinc at an S/Zn molar flow rate ratio of 10, are introduced thereto, so that a ZnS:Mn thin film is grown on the surface of the insulating layer 63 maintaining a thickness of about 500 nm under a pressure of 0.52 Torr during the reaction. At this moment, DCPM is introduced at a ratio of 0.85% by weight relative to the flow rate of zinc material.

On the thus obtained light emitting layer 64 are further formed an insulating layer 65 composed of $Ta_2O_5/SiO_2$ and a metal electrode 46 to fabricate an electroluminescent device.

For the purpose of comparison, an electroluminescent device is fabricated under the same conditions using TCM as a source of manganese instead of using DCPM.

Tables 3 and 4 show relationship among the substrate temperature during the reaction, average grain size of the ZnS layer, manganese density in the layer (percent by weight of manganese in the ZnS:Mn layer), and relative intensity of when an AC voltage of 150 volts, 50 Hz, duty 1/10 is applied, using the aforementioned two kinds of samples.

TABLE 3

| Electroluminescent device using DCPM | | | |
|---|---|---|---|
| Substrate temp. (°C.) | Average grain size (nm) | Relative intensity (%) | Manganese density in layer (wt. %) |
| 200 | 36 | 200 | 0.4 |
| 250 | 40 | 300 | 0.7 |
| 300 | 46 | 350 | 0.8 |
| 350 | 37 | 400 | 0.8 |
| 400 | 15 | 200 | 0.8 |
| 430 | 10 | 100 | 0.8 |

TABLE 4

| Electroluminescent device using TCM | | | |
|---|---|---|---|
| Substrate temp. (°C.) | Average grain size (nm) | Relative intensity (%) | Manganese density in layer (wt. %) |
| 200 | 36 | 0 | 0 |
| 250 | 40 | 0 | 0 |
| 300 | 46 | 30 | 0.04 |
| 350 | 34 | 40 | 0.08 |
| 400 | 15 | 80 | 0.12 |
| 430 | 10 | 75 | 0.2 |

Figure 5:
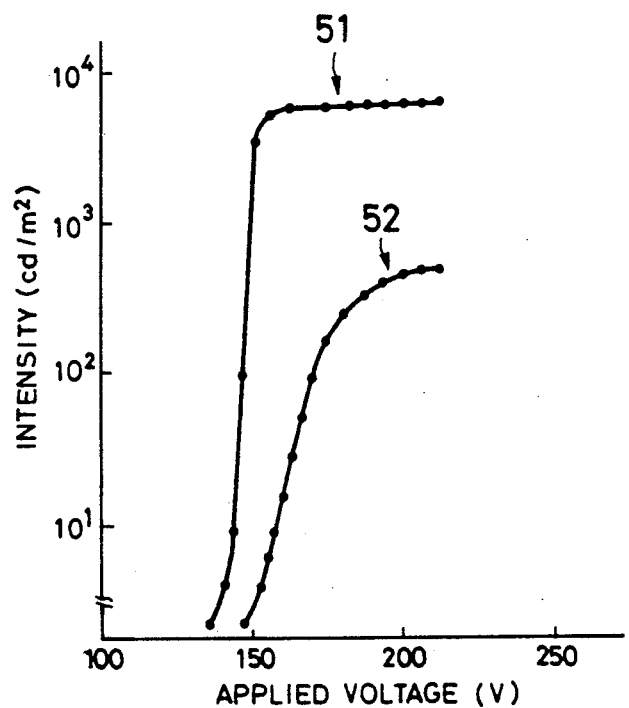
FIG. 5 is a graph showing a relationship between the intensity and the applied voltage using the electroluminescent device manufactured according to the present invention and the electroluminescent device manufactured according to the prior method.

Here, the average grain size is based on the X-ray diffraction measurements of full-width of half-maximum, and the relative intensity represents a value of when the intensity is 100 that is obtained by the light emitting layer fabricated by the standard electron beam deposition method. FIG. 5 illustrates intensity vs. applied voltage characteristics of when a sinusoidal wave voltage of 1 KHz is applied to the two samples that exhibit highest intensities. In the case of the device 51 obtained using DCPM as a source of manganese, the light is emitted at a reduced voltage and the drive voltage decreases compared with the device 52 obtained using TCM. With the device 51, in particular, the intensity sharply rises near the threshold voltage thereof. When a voltage of 170 volts is applied, the intensity is about nine times as great as that of the device 52. The light emitting efficiency is 4.8 lm/W in the case of the device 51 of DCPM which is a remarkable improvement over the device 52 of TCM that exhibits light emitting efficiency of 0.8 lm/W.

From these results it is learned that the device obtained by using DCPM exhibits superior characteristics inclusive of intensity to those of the devices obtained by depositing EB film or by using TCM.

EMBODIMENT 7

A further embodiment will now be explained with continuing reference to FIG. 6. A substrate on which have been formed up to the insulating layer 63 in placed in a reaction vessel which is evacuated to a high degree of vacuum (about $1 \times 10^{-7}$ Torr), a hydrogen gas containing DCPM is introduced thereinto followed by the introduction of the vapor of an adduct of diethyl zinc and diethyl sulfide as well as hydrogen sulfide as a source of the group VI, which are then brought into contact with the insulating layer on the substrate heated at various temperatures over a range of 200° to 430° C., in order to form a ZnS:Mn crystal layer 64 having a thickness of about 500 nm. On the ZnS:Mn layer 64 is further formed an insulating layer 65 composed of Ta$_2$O$_5$/SiO$_2$ having a thickness of 250 nm, followed by the formation of a metal electrode composed of aluminum thereby to fabricate an electroluminescent device. When an AC sinusoidal wave voltage of 200 volts, 1 KHz is applied, the device fabricated at a substrate temperature of 300° C. exhibits a maximum intensity of 1460 ft-L. For the purpose of comparison, an electroluminescent device fabricated through the same steps as described above using TCM as a source of manganese is measured for its intensity under the same conditions. The device exhibits a highest intensity when it is fabricated at a substrate temperature of 430° C., the intensity, however, being as small as 340 ft-L.

The same results are obtained even when there is used an adduct of diethyl zinc and dimethyl sulfide, or an adduct of dimethyl zinc and diethyl sulfide or dimethyl sulfide.

In the foregoing were described preferred embodiments of the present invention. Here, it is also allowable to use in combination the vapors of di-π-cyclopentadienyl manganese, d-π-methylcyclopentadienyl manganese and di-π-ethylcyclopentadienyl manganese which are sources of manganese. In this case, the ratio of partial pressures will be naturally determined depending upon the pressures of the vapors, which, however, is not at all detrimental to putting the invention into practice. This fact can be easily comprehended by people skilled in the art.

According to the manufacturing method of the present invention as will be obvious from the foregoing embodiments, the intermediate decomposition products are not mixed into the light emitting layer, non-emitting centers are not formed in the crystal lattice, carbon concentration does not increase in the light emitting layer, and manganese masses are not incorporated in the light emitting layer unlike the prior art. Namely, there is formed on the insulating layer a highly pure and highly crystalline ZnS:Mn or ZnSe:Mn light emitting layer close to a stoichiometrical composition. Therefore, there is obtained an electroluminescent device that operates on a low voltage and that features a high light emitting efficiency and high reliability, without requiring any auxiliary energy but the energy for heating the substrate.

Although the invention has been described mainly with reference to an ACTFEL device, it is to be appreciated that other semiconductor devices are applicable, including DC electroluminescent device, light emitting diode of the MIS structure, visible semiconductor laser, and the like.

The invention has been described with reference to the preferred embodiments. Obviously, modifications and alterations will occur to those of ordinary skill in the art upon reading and understanding the present invention be construed as including all such alterations and modifications in so far as they come within the scope of the appended claims or the equivalent thereof. Especially, it is to be appreciated that the present invention is applicable to semiconductor devices which have manganese-doped zinc chalcogenide, such as ZnS:Mn or ZnSe:Mn.

Having thus described the preferred embodiments, the invention is now claimed to be:

1. A method of manufacturing a semiconductor device wherein manganese-doped zinc chalcogenide is grown by bringing a heated substrate into contact with a non-plasma atmosphere which contains the vapor of an organazinc compound, the vapor of a chalcogenide compound, and at least one vapor selected from the group consisting of di-π-cyclopentadienyl manganese and di-π-alkylcyclopentadienyl manganese.

2. The method as set forth in claim 1, wherein the temperature of the substrate during the growth of the manganese-doped zinc chalcogenide is from 100° to 390° C.

3. The method as set forth in claim 2, wherein the di-π-alkyl cyclopentadienyl manganese is di-π-methyl cyclopentadienyl manganese or di-π-ethyl cyclopentadienyl manganese.

4. The method as set forth in claim 2, wherein the organozinc compound is at least the one selected from the group consisting of dimethyl zinc and diethyl zinc.

5. The method as set forth in claim 4, wherein the chalcogenide compound is at least the one selected from the group consisting of dimethyl chalcogenide, diethyl chalcogenide and hydrogen chalcogenide.

6. The method as set forth in claim 5, wherein the dimethyl chalcogenide is dimethyl sulfide or dimethyl selenide.

7. The method as set forth in claim 5, wherein the diethyl chalcogenide is diethyl sulfide or diethyl selenide.

8. The method as set forth in claim 5, wherein the hydrogen chalcogenide is hydrogen sulfide or hydrogen selenide.

9. The method as set forth in claim 5, wherein the organozinc compound and the chalcogenide compound are adducts of dialkyl zinc and dialkyl chalcogenide.

10. The method as set forth in claim 9, wherein the dialkyl zinc is at least the one selected from the group consisting of dimethyl zinc and diethyl zinc.

11. The method as set forth in claim 9, wherein the dialkyl chalcogenide is at least the one selected from the group consisting of dimethyl sulfide and diethyl sulfide.

12. A method of manufacturing a semiconductor device comprising:
   a first step for forming a first electrode layer on a substrate;
   a second step for forming a first insulating layer on the first electrode layer so as to form a substrate;
   a third step for forming a light emitting layer composed of manganese-doped zinc chalcogenide on the substrate by bringing the substrate into contact with a non-plasma atmosphere which contains the vapor of an organozinc compound, the vapor of a chalcogenide compound, and the vapor of at least the one selected from the group consisting of di-$\pi$-cyclopentadienyl manganese and di-$\pi$-alkyl cyclopentadienyl manganese;
   a fourth step for forming a second insulating layer on the light emitting layer; and
   a fifth step for forming a second electrode layer on the second insulating layer.

13. The method as set forth in claim 12, wherein the first electrode layer is transparent.

14. The method as set forth in claim 12, wherein the first and the second electrode layers form a plurality of striped electrodes, respectively, and the striped electrodes formed by the first electrode layer and the striped electrodes formed by the second electrode layer are arranged in a crossing manner relative to each other.

15. The method as set forth in claim 12, wherein the temperature of the substrate during the growth of the manganese-doped zinc chalcogenide is from 100° to 390° C.

16. The method as set forth in claim 15, wherein the di-$\pi$-alkyl-cyclopentadienyl manganese is di-$\pi$-methyl-cyclopentadienyl manganese or di-$\pi$-ethylene-cyclopentadienyl manganese.

17. The method as set forth in claim 15, wherein the organozinc compound is at least one selected from the group consisting of dimethyl zinc and diethyl zinc.

18. The method as set forth in claim 17, wherein the chalcogenide compound is at least one selected from the group consisting of dimethyl chalcogenide, diethyl chalcogenide and hydrogen chalcogenide.

19. The method as set forth in claim 18, wherein the dimethyl chalcogenide is dimethyl sulfide or dimethyl selenide.

20. The method as set forth in claim 18, wherein the diethyl chalcogenide is diethyl sulfide or diethyl selenide.

21. The method as set forth in claim 18, wherein the hydrogen chalcogenide is hydrogen sulfide or hydrogen selenide.

22. The method as set forth in claim 1, wherein the atmospheric pressure is from 0.3 Torr to 1 atm.

* * * * *